(12) United States Patent
Park et al.

(10) Patent No.: US 7,253,704 B2
(45) Date of Patent: Aug. 7, 2007

(54) RF DUPLEXER

(75) Inventors: Yun-kwon Park, Dongducheon-si (KR); Jong-seok Kim, Taean-eub (KR); In-sang Song, Seoul (KR); Duck-hwan Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 10/996,045

(22) Filed: Nov. 24, 2004

(65) Prior Publication Data

US 2005/0195047 A1    Sep. 8, 2005

(30) Foreign Application Priority Data

Nov. 28, 2003  (KR) .................. 10-2003-0085687

(51) Int. Cl.
*H03H 9/70* (2006.01)
*H03H 3/007* (2006.01)

(52) U.S. Cl. ...................... 333/133; 333/189
(58) Field of Classification Search ........... 333/133, 333/189

See application file for complete search history.

(56) References Cited

U.S. PATENT DOCUMENTS

| | | | |
|---|---|---|---|
| 5,561,406 A * | 10/1996 | Ikata et al. ................ 333/126 |
| 6,262,637 B1 * | 7/2001 | Bradley et al. ............. 333/133 |
| 6,919,777 B2 * | 7/2005 | Taniguchi et al. .......... 333/133 |
| 6,927,649 B2 * | 8/2005 | Metzger et al. ............. 333/133 |
| 6,943,645 B2 * | 9/2005 | Taniguchi ................... 333/133 |
| 6,949,990 B2 * | 9/2005 | Nishihara et al. ........... 333/189 |
| 7,053,730 B2 * | 5/2006 | Park et al. ................... 333/133 |
| 7,053,731 B2 * | 5/2006 | Iwamoto et al. ............ 333/133 |

\* cited by examiner

*Primary Examiner*—Barbara Summons
(74) *Attorney, Agent, or Firm*—Sughrue Mion, PLLC (57) ABSTRACT

A compact and high-performance RF duplexer and fabrication method thereof, the RF duplexer includes a first filter and a second filter suspended over the substrate connected in series and in parallel and having a plurality of resonators, for passing signals of different frequency bands. A plurality of inductors are connected in series with the parallel resonators of the first and second filters and formed on the substrate. A phase shifter is formed on the substrate for preventing a signal interference between the first and second filters, and a supporter supports the first and second filters and has a plurality of bumps at certain parts on the substrate to electrically connect terminals of the first and second filter with terminals of the substrate. Accordingly, the size of the duplexer is reduced by forming the tuning inductors around the bumps of the PCB.

12 Claims, 6 Drawing Sheets

RF DUPLEXER

CROSS-REFERENCE TO RELATED APPLICATIONS

This application claims priority under Korean Patent Application No. 2003-85687, filed on Nov. 28, 2003 with the Korean Intellectual Property Office, the disclosure of which is incorporated herein by reference in its entirety.

BACKGROUND OF THE INVENTION

1. Field of the Invention

The present invention relates generally to a radio frequency (RF) duplexer and a fabricating method thereof. More specifically, the present invention is directed to a compact RF duplexer in which a tuning inductor of a band pass filter at transmitting and receiving ends is formed around a connecting electrode of a printed circuit board (PCB) and a fabricating method thereof.

2. Description of the Related Art

A duplexer is a representative example of elements that use multiple filters. The duplexer properly branches signals transmitted and received over a single antenna in a frequency division duplex (FDD) type communication system so that the same antenna can efficiently both transmit and receive.

The duplexer basically includes a transmitting filter and a receiving filter in addition to an antenna. The transmitting filter is a band pass filter for passing only a frequency for transmission, and the receiving filter is a band pass filter for passing only a frequency for reception. The duplexer enables the transmission and reception over the single antenna by adjusting the frequencies passing through the transmitting and receiving filters.

As mobile communication devices, such as cellular telephones, become increasingly prevalent, demand for compact and lightweight filters used in such devices is also rising for implementation of the duplexer. Film bulk acoustic resonator (FBAR) duplexers are frequently used in the mobile communication devices, since the FBAR duplexer can be freely coupled with RF active elements, is compact and lightweight, can be mass-produced through semiconductor processes, and can be easily coupled with a monolithic microwave integrated circuit (MMIC). Also, the FBAR filters can obtain a high quality factor (Q) value, can be used in a micro-frequency band, and, more particularly, can be implemented in Personal Communication System (PCS) and Digital Cordless System (DCS) bands.

Since the difference between the frequencies of the signals transmitted and received through the transmitting filter and the receiving filter is small, the signals influence each other, giving rise to interference. Accordingly, a phase shifter, which isolates the transmitting filter and the receiving filter from each other to prevent mutual interference, may be incorporated in the duplexer to improve performance. The phase shifter generally includes a capacitor and an inductor, and prevents mutual interference by introducing a phase difference of 90° between the frequencies of the transmitted signal and the received signal.

Figure 1:
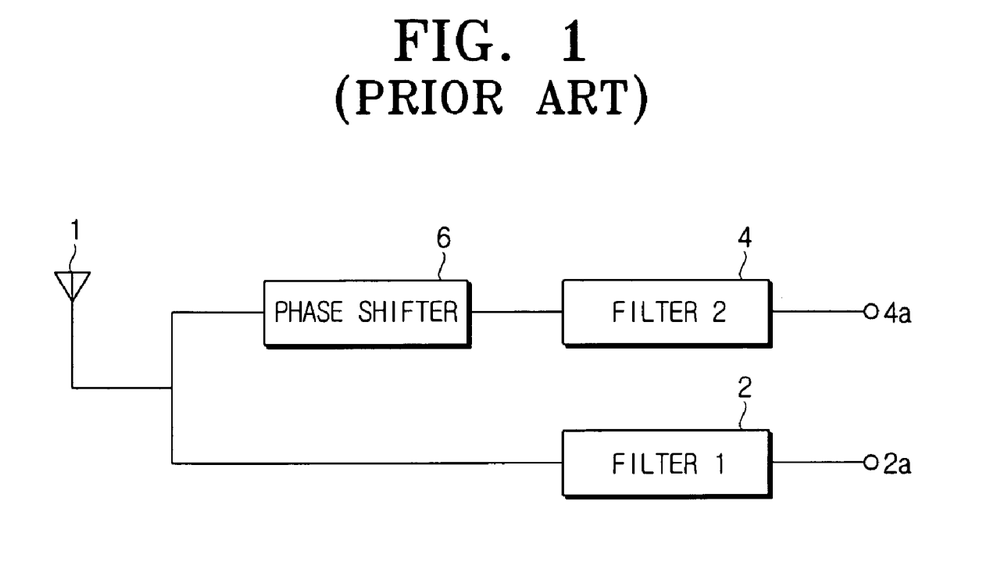
FIG. 1 is a schematic block diagram illustrating a conventional duplexer.

Referring to FIG. 1, the FBAR duplexer includes transmitter FBAR filter 2, receiver FBAR filter 2 4, and a phase shifter 6. The transmitter FBAR filter 2 filters and transmits a signal input from a transmitting terminal 2a through an antenna 1. The receiver FBAR filter 4 filters and transmits a signal received through the antennal 1 to a receiving terminal 4a. The phase shifter 6 is interposed between the antenna 1 and the receiver filter 4, and shifts phases of the transmitted and received signals to prevent signal interference between the transmitter FBAR filter 2 and the receiver FBAR filter 4.

Figure 2:
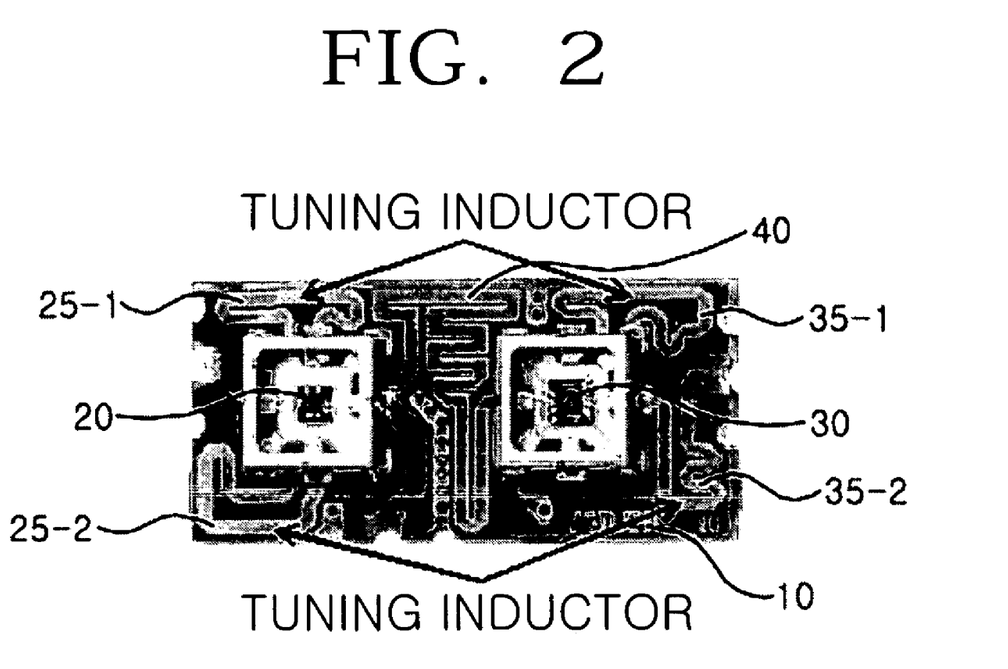
FIG. 2 is a view illustrating a structure of a duplexer of Agilent Technologies Co.

FIG. 2 illustrates a structure of a duplexer provided by Agilent Technologies Co. Referring to FIG. 2, a transmitter band pass filter chip 20 and a receiver band pass filter chip 30 are spaced at a predetermined interval on a printed circuit board (PCB) 10 by wire bonding. A phase shifter 40 is formed between the transmitter band pass filter chip 20 and the receiver band pass filter chip 30. The two filters 20 and 30 have a size of 3 mm×3 mm to 5 mm×5 mm. Tuning inductors 25-1, 25-2, 35-1, and 35-2 are formed in a width of 20~30 μm in vicinity of pads of the filters 20 and 30. Accordingly, the total size of the Agilent duplexer reaches about 6 mm×12 mm as the tuning inductors occupy certain areas on the board and are wire bonded. However, the size of the duplexer needs to be reduced in order to realize compactness of the RF duplexer.

SUMMARY OF THE INVENTION

The present invention has been developed in order to solve the above drawbacks and other problems associated with the conventional arrangement. An exemplary aspect of the present invention is to provide a compact RF duplexer which is implemented by forming tuning inductors around connecting electrodes on a substrate so as to omit a wire bonding process and a fabricating method thereof.

To achieve the above exemplary aspect of the present invention, the RF duplexer includes a substrate, a first filter suspended over the substrate at a certain height, and having a plurality of resonators which are connected in series and in parallel, for passing a signal of a first frequency band, a second filter suspended over the substrate at a certain height, and having a plurality of resonators which are connected in series and in parallel, for passing a signal of a second frequency band different from the first frequency band, a plurality of inductors connected in series with the parallel resonators of the first and second filters and formed on the substrate, a phase shifter formed on the substrate for preventing a signal interference between the first and second filters by introducing a phase difference of 90° between the signals input to the first and second filters, and a supporter for supporting the first and second filters and having a plurality of bumps at certain parts on the substrate to electrically connect terminals of the first and second filter with terminals of the substrate.

The supporter includes four bumps for connecting input and output signal lines of the first and second filters, respectively. The supporter includes a plurality of bumps for connecting the plurality of the parallel resonators with inductors respectively. The inductors are connected with the certain bumps and formed around the bumps.

The supporter includes a plurality of bumps which connect the grounds of the first and second filters with the ground of the substrate.

The method for fabricating the RF duplexer includes forming a first filter, the first filter being suspended over a substrate at a certain height and having a plurality of resonators which are connected in series and in parallel, for passing a signal of a first frequency band, forming a second filter, the second filter being suspended over the substrate at a certain height having a plurality of resonators which are connected in series and in parallel, for passing a signal of a second frequency band different from the first frequency band, forming more than two inductors electrically connected with the parallel resonators of the first and second filters on the substrate, forming a phase shifter formed on the substrate for preventing a signal interference between the first and second filters by introducing a phase difference of 90° between the signals input to the first and second filters, forming a supporter for supporting the first and second filters and having a plurality of bumps at certain parts on the substrate to electrically connect terminals of the first and second filters with terminals of the substrate, and bonding the substrate with the first and second filters, respectively.

The supporter includes four bumps for connecting input and output signal lines of the first and second filters. The supporter includes a plurality of bumps for connecting the plurality of the parallel resonators and the inductors. The inductors are connected with the certain bumps and formed around the bumps.

The supporter includes a plurality of bumps which connect the grounds of the first and second filters with the ground of the substrate.

BRIEF DESCRIPTION OF THE DRAWING FIGURES

These and/or other exemplary aspects and advantages of the invention will become apparent and more readily appreciated from the following description of exemplary embodiments, taken in conjunction with the accompanying drawing figures of which.

DETAILED DESCRIPTION OF EXEMPLARY EMBODIMENTS

Reference will now be made in detail to exemplary embodiments of the present invention, examples of which are illustrated in the accompanying drawing figures, wherein like reference numerals refer to the like elements throughout. The exemplary embodiments are described below in order to explain the present invention by referring to the drawing figures.

Figure 3A:
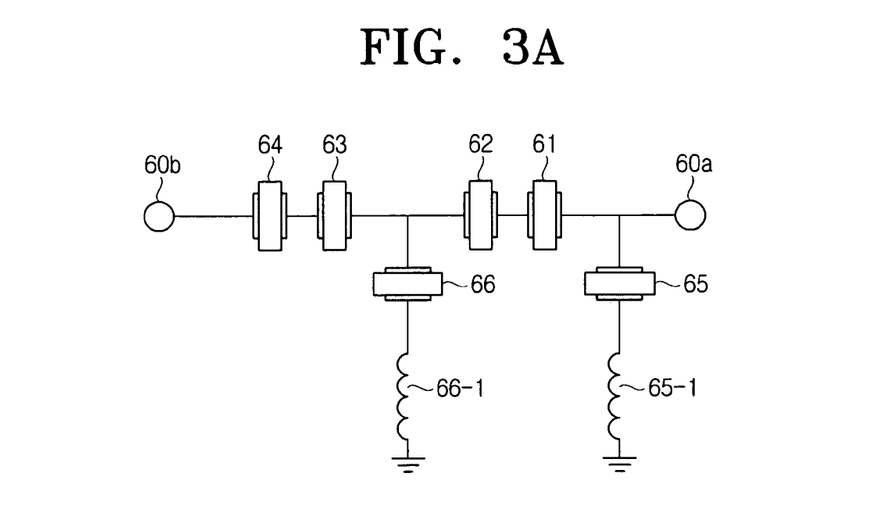
FIG. 3A is a diagram illustrating a structure of a band pass filter including tuning inductors according to an exemplary embodiment of the present invention.
Figure 3B:
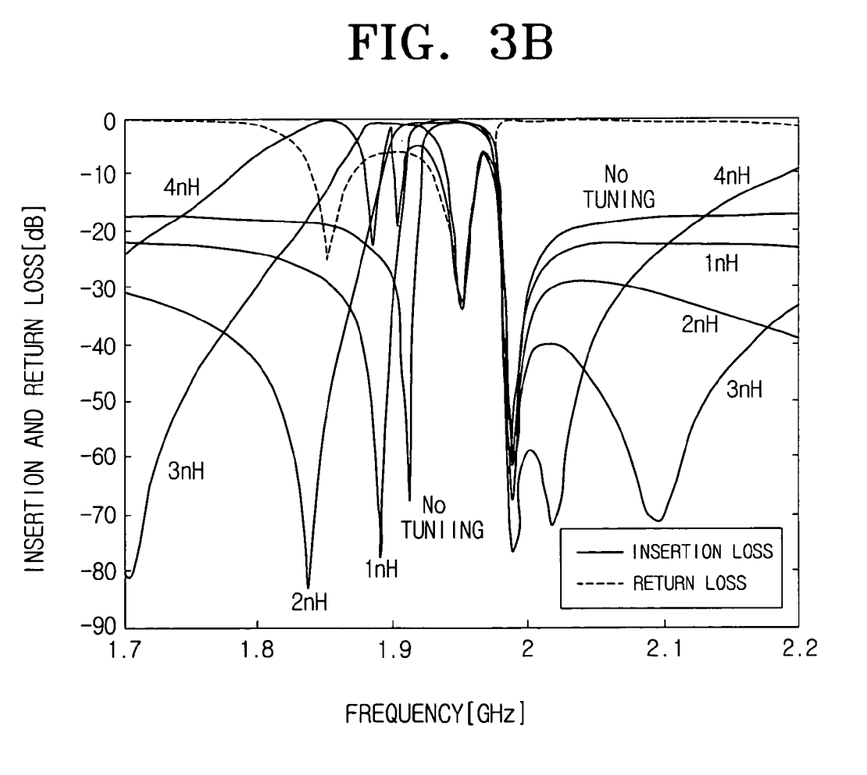
FIG. 3B is a graph illustrating an attenuation characteristic of the band pass filter with respect to the tuning inductors of FIG. 3A.

A band pass filter is described in detail below, which is one of the constituents of a duplexer according to an exemplary embodiment of the present invention. An attenuation characteristic of a filter can be improved by connecting a certain resonator among resonators of the filter with a series or a shunt inductor. FIG. 3A is a diagram illustrating a structure of the band pass filter, in which shunt resonators are connected with tuning inductors in series. FIG. 3B is a graph illustrating the attenuation characteristic of the band pass filter according to inductance values of the tuning inductors of FIG. 3A.

The band pass filter according to an exemplary embodiment of the present invention, selects and outputs only a signal of a certain frequency band among signals input from an input end 60a, and outputs the selected signal to an output end 60b.

The band pass filter includes four film bulk acoustic resonators (FBARs) 61, 62, 63 and 64 in series and two FBARs 65 and 66 in parallel as shown in FIG. 3A. The FBARs are fabricated by depositing a lower electrode, a piezoelectric layer, and an upper electrode in that order. When a voltage is applied to the lower and upper electrodes, an electric field is generated between the two electrodes and the piezoelectric layer produces a piezoelectric effect which converts the applied electric signal into a mechanical energy in the form of an acoustic wave to thus generate a resonance. The band pass filter is implemented using the FBARs according to an exemplary embodiment of the present invention, but various resonators may be utilized.

Inductors 65-1 and 66-1 are respectively connected in series to the parallel FBARs 65 and 66. FIG. 3B is a graph of the attenuation characteristic of the filter when the inductors are not connected and inductances of the connected inductors are varied to 1 nH, 2 nH, 3 nH, and 4 nH. Referring to FIG. 3B, solid lines indicate an insertion loss. The attenuation characteristic is considered to be good when the insertion loss in a frequency band to be used approaches to zero and abruptly increases in the vicinity of band-edge frequencies. The insertion loss rapidly increases around 1.98 GHz when the inductors are connected, as compared with the insertion loss when the inductors are not connected. In addition, the more the inductance value increases, the more the insertion loss rapidly increases. A signal of a frequency band to be transmitted can be selectively passed if the band pass filter is implemented by connecting inductors of appropriate inductance. According to an exemplary embodiment of the present invention, inductance values are set to 3~4 nH to implement the filter.

A band pass filter at a receiving end has the same structure as the filer at the transmitting end. The difference lies in FBAR and inductors which are formed to selectively output a signal of a frequency band different from the frequency band of the band pass filter at the transmitting end.

Figure 4:
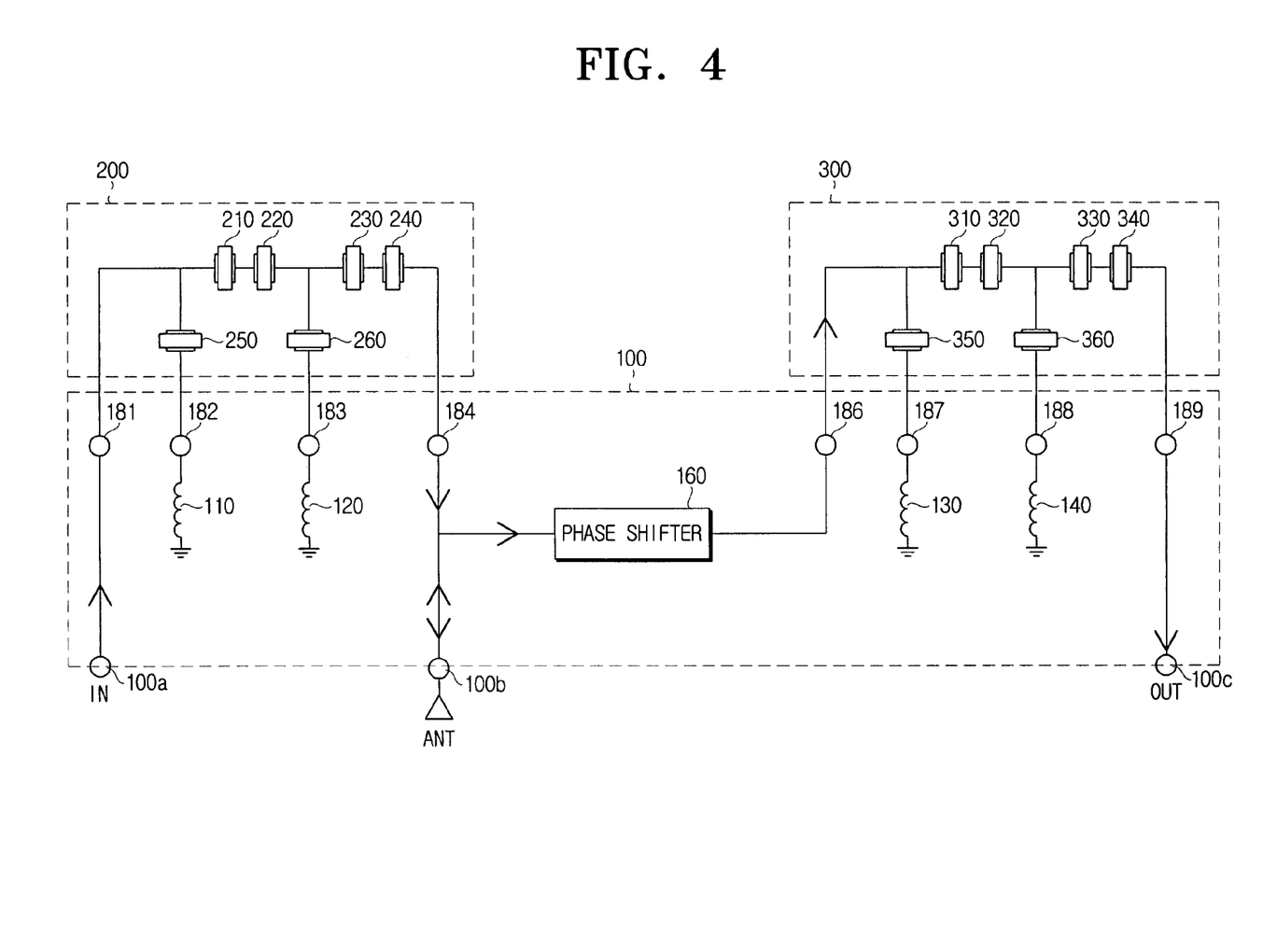
FIG. 4 is a diagram illustrating a structure of the duplexer according to an exemplary embodiment of the present invention.

FIG. 4 illustrates a structure of a radio frequency (RF) duplexer according to an exemplary embodiment of the present invention. Referring to FIG. 4, the RF duplexer includes a printed circuit board (PCB) 100, a transmitter band pass filter 200, and a receiver band pass filter 300.

The transmitter and receiver band pass filters 200 and 300, which include a plurality of FBARs, are fabricated with a micro-chip through the semiconductor fabricating process. The transmitter and receiver band pass filters 200 and 300 are implemented as a single-chip duplexer by bonding with pads formed on the PCB 100 using a bumping method. If using a conventional wire bonding, there are problems such as limitation in expanding lead (a passage for transmitting an electrical signal) and loss at the wire, while the bumping can address these problems.

The bumping method is performed by forming conductive bumps which are external terminals in the form of a protrusion having a size from tens of μm to hundreds of μm, on the pads with a metal material such as gold or solder and connecting the pads with the filters by use of the bumps. Conductive bumps connect the transmitter and receiver band pass filter 200 and 300 with the pads on the PCB 100 through the bumping. Hence, paths of the electrical wiring are shortened, and an electrical resistance and noise are lessened to thus enhance the electrical performance.

The bumping can be divided into an electroplating method which extracts metal by using a rectifier, and an electroless plating method which extracts metal by using a reducing agent. According to the metal material in use, the bumping may be classed into a gold (Au) bumping method, a solder bumping method, and a Ni/Cu bumping method. The gold (Au) bumping method is classified into a gold (Au) electroplating bumping method and an Au Stud bumping method. The solder bumping method is classed into a vapor deposition method, an electroplating method, a printing method, and a robotic ball placement method. Advantageously, the electroplating method of the solder bumping method may be used, which is suitable for the mass production and the accurate bumping fabrication.

Still referring to FIG. 4, the PCB 100 includes first to fourth inductors 110, 120, 130, and 140 to select a certain frequency band of the transmitter and receiver band pass filters 200 and 300, a phase shifter 160 to prevent an inter-signal interference between the transmitter and receiver band pass filters 200 and 300, and a plurality of bumps 181, 182, 183, and 184, and 186, 187, 188, and 189 to electrically connect pads of the PCB 100 with the transmitter and receiver band pass filters 200 and 300, respectively, and to support the filter chips.

The phase shifter 160 may obtain a phase difference 90° with respect to an input by depositing a capacitor and a coil in order to form a LC parallel circuit or by implementing a transmission line having a quarter length of the wave λ of a transmitter signal, to delay the signal from the transmitter. The conventional duplexer has the structure that the phase shifter 160 is separately fabricated and bonded onto the PCB 100. According to an exemplary embodiment, the phase shifter 160 is built in the PCB 100 to thus reduce the entire size of the duplexer.

The RF duplexer operates as below. The transmitter signal, which is input through an input terminal 100*a* formed on the PCB 100, is filtered into a predetermined frequency by the transmitter band pass filter 200, and is sent out externally via an antenna 100*b* connected to the PCB 100. A receiver signal, which is input via the antenna 100*b*, is passed through the phase shifter 160, filtered into a predetermined frequency by the receiver band pass filter 300, and sent out to an output terminal 100*c*.

Figure 5A:
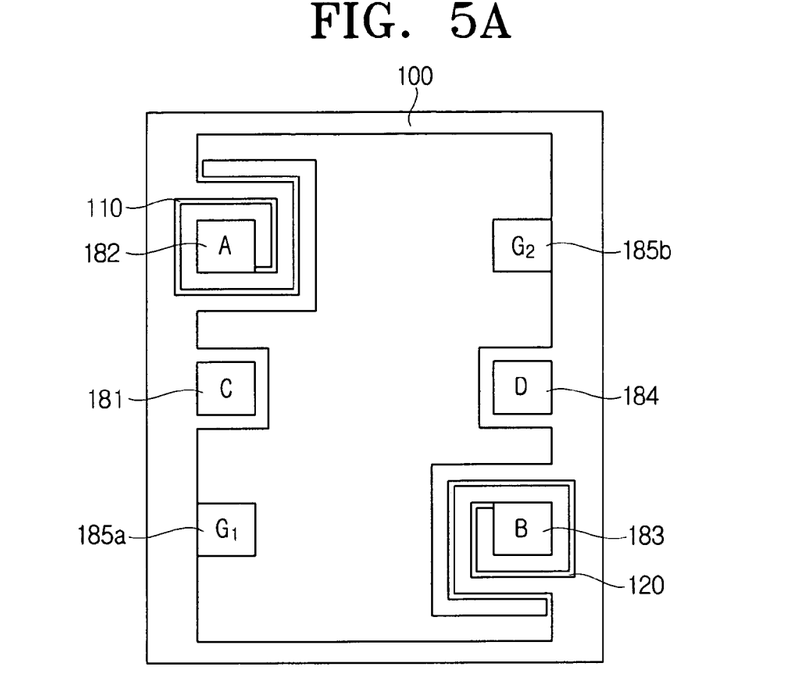
FIG. 5A is a diagram illustrating an arrangement of the tuning inductors and bumps.
Figure 5B:
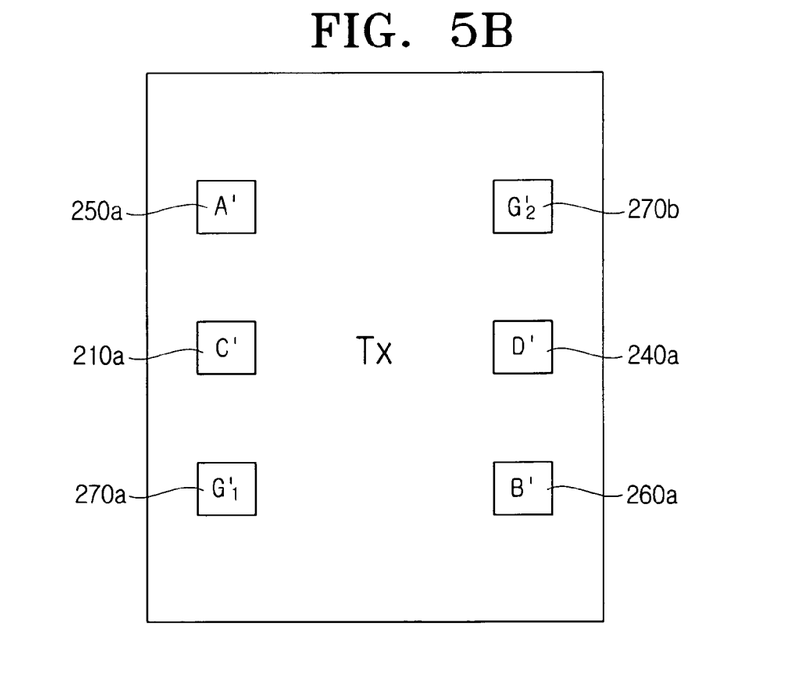
FIG. 5B is a diagram illustrating an alignment of electrodes of the filter corresponding to the bumps of FIG. 5A.

FIGS. 5A and 5B illustrate the arrangement of the inductors and electrical connections of the PCB 100 and the transmitter band pass filter 200. Referring to FIG. 5A, two bumps 182 and 183 are respectively formed in areas A and B. The two bumps 182 and 183 electrically connect first and second parallel resonators 250 and 260 of FIG. 4 with first and second inductors 110 and 120 on the PCB 100. Two bumps 181 and 184 are respectively formed in areas C and D, which connect a signal line for inputting and outputting the transmitter signal. Two bumps 185*a* and 185*b* are respectively formed in areas G$_1$ and G$_2$, and connect a ground of the PCB 100 with that of the transmitter band pass filter 200. Each bump is formed in a size of 100 μm×100 μm and to a height of 10 μm.

The first and second inductors 110 and 120 are formed in a linewidth of about 5 μm and a thickness of several of μm surrounding the bumps 182 and 183 formed in the areas A and B, and is electrically connected by one end with the bumps 182 and 183, respectively.

FIG. 5B illustrates a wiring alignment on a pad of the transmitter band pass filter 200. The transmitter band pass filter 200 is formed at a center of the pad, and six terminals are formed around the pad. The terminals are electrically connected with certain elements of the transmitter band pass filter 200.

The terminal A' 250*a* is connected with the first parallel FBAR 250, and with the bump 182 of the area A in FIG. 5A when bonding the PCB 100 with the transmitter band pass filter 200. The terminal B' 260*a* is connected with the second parallel FBAR 260, and with the bump 183 of the area B in FIG. 5A when bonding the PCB 100 with the transmitter band pass filter 200.

The terminal C' 210*a* is connected with the first serial resonator 210 and the first parallel resonator 250, and with the bump 181 of the area C in FIG. 5A when bonding the PCB 100 with the transmitter band pass filter 200. The terminal D' 240*a* is connected with the fourth serial resonator 240, and with the bump 184 of the area D in FIG. 5A when bonding the PCB 100 with the transmitter band pass filter 200.

The terminals G$_1$' 270*a* and G$_2$' 270*b* are connected with the ground of the transmitter band pass filter 200, and each is connected with the bumps 185*a* and 185*b* of the areas G$_1$ and G$_2$ in FIG. 5A when bonding the PCB 100 with the transmitter band pass filter 200.

Figure 6:
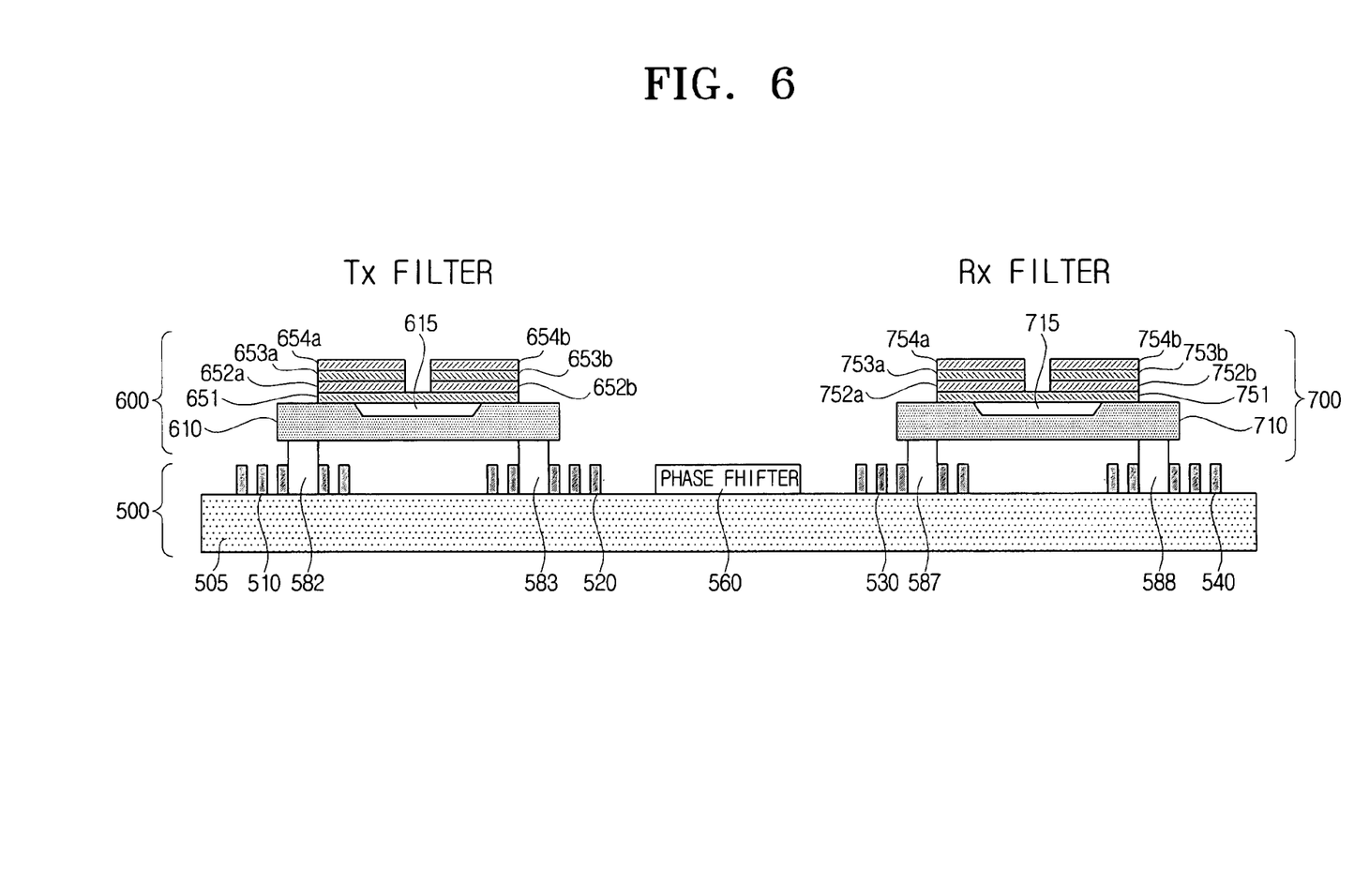
FIG. 6 is a cross sectional view of the duplexer according to an exemplary embodiment of the present invention.

The fabricating process of the RF duplexer according to an exemplary embodiment of the present invention is described below. FIG. 6 is a cross sectional view of the duplexer according to an exemplary embodiment of the present invention. The RF duplexer is implemented by fabricating the transmitter and receiver band pass filters 600 and 700 and bonding the transmitter and receiver pass filters 600 and 700 with the PCB 500.

The transmitter and receiver band pass filters 600 and 700 are fabricated in the same process. Accordingly, the detailed description is made only for the transmitter band pass filter 600 for the conciseness. A cavity 615 is formed on a certain part of a semiconductor substrate 610. A sacrificial material fills up the cavity 615 and an insulating film 651 is deposited on the cavity 615. First electrodes 652*a* and 652*b*, piezoelectric layers 653*a* and 653*b*, and second electrodes 654*a* and 654*b* are deposited on the insulating film 651 in order.

The first and second electrodes 652*a*, 652*b*, 654*a*, and 654*b* may utilize a conductive material such as metals, and advantageously, one of aluminum (Al), tungsten (W), gold (Au), platinum (Pt), nickel (Ni), titanium (Ti), chromium (Cr), palladium (Pd), and molybdenum (Mo).

In general, a piezoelectric material uses aluminum nitride (AlN) or zinc oxide (ZnO), but is not limited to these examples. The deposition may be performed using RF magnetron sputtering or evaporation.

After forming the second electrodes 654*a* and 654*b*, an etching hole is penetrated through a certain part of the insulating film 651, the sacrificial material is removed using a dry etching, and the etching hole is filled up. Hence, the transmitter and receiver band pass filters 600 and 700 are fabricated.

A patterning is performed for inductors 510, 520, 530, and 540 which are 5 μm in width and to be formed on a PCB 505. The inductors 510, 520, 530, and 540 are formed by depositing gold (Au) in a thickness of several μm along the formed patterns.

A phase shifter 560 is formed by depositing a capacitor implemented with two metal layers and a dielectric layer between the two metal layers and the inductors implemented by fabricating a metal into a coil form.

Bumps are formed by gold (Au) electroplating bumping according to an exemplary embodiment of the present invention. Specifically, a plurality of bumps 582, 583, 587, and 588 are formed by depositing a conductive material, such as gold (Au), in a size of 100 μm×100 μm and in a thickness of 10 μm on area A, B, C, D, $G_1$, and $G_2$ of FIG. 5A.

The PCB 500, the transmitter band pass filter 600, and the receiver band pass filter 700 are adhered to each other using adhesive bonding and/or eutectic bonding, without using wire bond. As a result, the RF duplexer is implemented in a single chip.

According to an exemplary embodiment of the present invention, the size of the duplexer is reduced by forming the tuning inductors around the bumps of the PCB. In addition, the stability of the RF duplexer is enhanced due to the absence of the wire bonding process.

While exemplary embodiments of the present invention have been described, additional variations and modifications of the exemplary embodiments may occur to those skilled in the art once they learn of the basic inventive concepts. Therefore, it is intended that the appended claims shall be construed to include the above exemplary embodiments and all such variations and modifications that fall within the spirit and scope of the invention.

What is claimed is:

1. A radio frequency (RF) duplexer comprising:
   a substrate;
   a first filter suspended over the substrate, and having a first plurality of resonators which are coupled in series and in parallel, passing a signal of a first frequency band;
   a second filter suspended over the substrate, and having a second plurality of resonators which are coupled in series and in parallel, passing a signal of a second frequency band different from the first frequency band;
   a plurality of inductors coupled in series with the parallel resonators of the first and second filters and formed on the substrate;
   a phase shifter formed on the substrate, preventing a signal interference between the first and second filters by introducing a phase difference between the signals input to the first and second filters;
   a supporter comprising a plurality of bumps supporting the first and second filters to electrically couple terminals of the first and second filter with terminals of the substrate;
   wherein the inductors are coupled to the plurality of bumps of the supporter, which are located at certain parts on the substrate, and the inductors are formed around the bumps.

2. The RF duplexer of claim 1, wherein the bumps of the supporter couple input and output signal lines of the first and second filters, respectively.

3. The RF duplexer of claim 1, wherein the plurality of bumps of the supporter couple at least one parallel coupled resonator of the first plurality of resonators and at least one parallel coupled resonator of the second plurality of resonators, with the plurality of inductors.

4. The RF duplexer of claim 1, wherein the phase difference between the signals input to the first and second filters is 90°.

5. The RF duplexer of claim 1, wherein the plurality of bumps of the supporter couple the first and second filters with an external ground.

6. A duplexer comprising:
   a substrate;
   a first filter;
   a second filter;
   a supporter comprising a plurality of bumps supporting the first and second filters to electrically connect the first and second filters with the substrate; and
   a plurality of inductors respectively connecting the first and second filters to the substrate and coupled to at least some of the plurality of bumps of the supporter and disposed around the at least some of the plurality of bumps.

7. A method for fabricating a radio frequency (RF) duplexer, comprising:
   forming a first filter, the first filter being suspended over a substrate and having a first plurality of resonators which are coupled in series and in parallel, passing a signal of a first frequency band;
   forming a second filter, the second filter being suspended over the substrate having a second plurality of resonators which are coupled in series and in parallel, passing a signal of a second frequency band different from the first frequency band;
   forming more than two inductors electrically coupled with the parallel resonators of the first and second filters on the substrate;
   forming a phase shifter formed on the substrate, preventing a signal interference between the first and second filters by introducing a phase difference between the signals input to the first and second filters;
   forming a supporter comprising a plurality of bumps supporting the first and second filters to electrically couple terminals of the first and second filters with terminals of the substrate;
   wherein the inductors are coupled to the plurality of bumps of the supporter, which are located at certain parts on the substrate, and the inductors are formed around the bumps; and
   bonding the substrate with the first and second filters, respectively.

8. The fabricating method of claim 7, wherein the bumps of the supporter couple input and output signal lines of the first and second filters.

9. The fabricating method of claim 7, wherein the plurality of bumps of the supporter couple at least one parallel coupled resonator of the first plurality of resonators and at least one parallel coupled resonator of the second plurality of resonators, with the inductors.

10. The fabrication method of claim 7, wherein the phase difference between the signals input to the first and second filters is 90°.

11. The fabricating method of claim 7, wherein the plurality of bumps of the supporter couple the first and second filters with an external ground.

12. A method for fabricating a duplexer, comprising;
   forming a first filter over a substrate;
   forming a second filter over the substrate;
   forming a supporter comprising a plurality of bumps supporting the first and second filter to electrically connect the first and second filters with the substrate; and
   forming a plurality of inductors respectively connecting the first and second filters to the substrate and coupled to at least some of the plurality of bumps of the supporter and disposed around the at least some of the plurality of bumps.

* * * * *